(12) United States Patent
Driemel et al.

(10) Patent No.: US 9,274,190 B2
(45) Date of Patent: Mar. 1, 2016

(54) LOCAL COIL

(71) Applicants: Daniel Driemel, Oederan (DE); Helmut Greim, Adelsdorf (DE); Steffen Wolf, Roettenbach (DE)

(72) Inventors: Daniel Driemel, Oederan (DE); Helmut Greim, Adelsdorf (DE); Steffen Wolf, Roettenbach (DE)

(73) Assignee: Siemens Aktiengesellschaft, München (DE)

( * ) Notice: Subject to any disclaimer, the term of this patent is extended or adjusted under 35 U.S.C. 154(b) by 641 days.

(21) Appl. No.: 13/675,938

(22) Filed: Nov. 13, 2012

(65) Prior Publication Data

US 2013/0119988 A1    May 16, 2013

(30) Foreign Application Priority Data

Nov. 14, 2011   (DE) .......................... 10 2011 086 285

(51) Int. Cl.
| | | |
|---|---|---|
| *G01V 3/00* | (2006.01) | |
| *G01R 33/34* | (2006.01) | |
| *G01R 33/3415* | (2006.01) | |
| *G01R 33/565* | (2006.01) | |

(52) U.S. Cl.
CPC .... *G01R 33/34092* (2013.01); *G01R 33/34007* (2013.01); *G01R 33/3415* (2013.01); *G01R 33/56518* (2013.01)

(58) Field of Classification Search
CPC ................................................. G01R 33/34092
USPC .......................................................... 324/322
See application file for complete search history.

(56) References Cited

U.S. PATENT DOCUMENTS

| | | | |
|---|---|---|---|
| 4,857,850 A | 8/1989 | Mametsa et al. | |
| 8,841,910 B2* | 9/2014 | Popescu | 324/318 |
| 2004/0124840 A1 | 7/2004 | Reykowski | |
| 2005/0127914 A1 | 6/2005 | Eberler et al. | |
| 2008/0129296 A1* | 6/2008 | Fischer et al. | 324/318 |
| 2008/0143333 A1 | 6/2008 | Greim et al. | |
| 2010/0033185 A1 | 2/2010 | Saha et al. | |
| 2010/0182211 A1* | 7/2010 | Peters | 343/730 |
| 2010/0201596 A1* | 8/2010 | Mieslinger et al. | 343/841 |

(Continued)

FOREIGN PATENT DOCUMENTS

| | | |
|---|---|---|
| DE | 102 44 172 A1 | 3/2004 |
| DE | 103 14 215 B4 | 11/2006 |

(Continued)

OTHER PUBLICATIONS

German Office Action dated Aug. 2, 2012 for corresponding German Patent Application No. DE 10 2011 086 285.4 with English translation.

German Office action for related German Application No. 10 2011 086 285.4, dated May 20, 2014, with English Translation.

*Primary Examiner* — Rodney Fuller
(74) *Attorney, Agent, or Firm* — Lempia Summerfield Katz LLC

(57) ABSTRACT

A local coil for a magnetic resonance tomography device includes a plurality of antenna elements. Each antenna element of the plurality of antenna elements has two conductor tracks. The conductor tracks are disposed on opposite sides of an insulator and are connected electrically conductively to one another by plated through-holes through the insulator. In areas, in which conductor tracks of at least two antenna elements of the plurality of antenna elements cross, at least one antenna element of the at least two antenna elements only has a conductor track on one side of the insulator.

19 Claims, 4 Drawing Sheets

(56) References Cited

U.S. PATENT DOCUMENTS

2011/0128111 A1* 6/2011 Roozeboom et al. ....... 336/84 R
2013/0241557 A1* 9/2013 Biber et al. .................. 324/322

FOREIGN PATENT DOCUMENTS

| DE | 10 2006 059 137 B3 | 7/2008 |
| DE | 10 2009 026 316 A1 | 2/2010 |

* cited by examiner

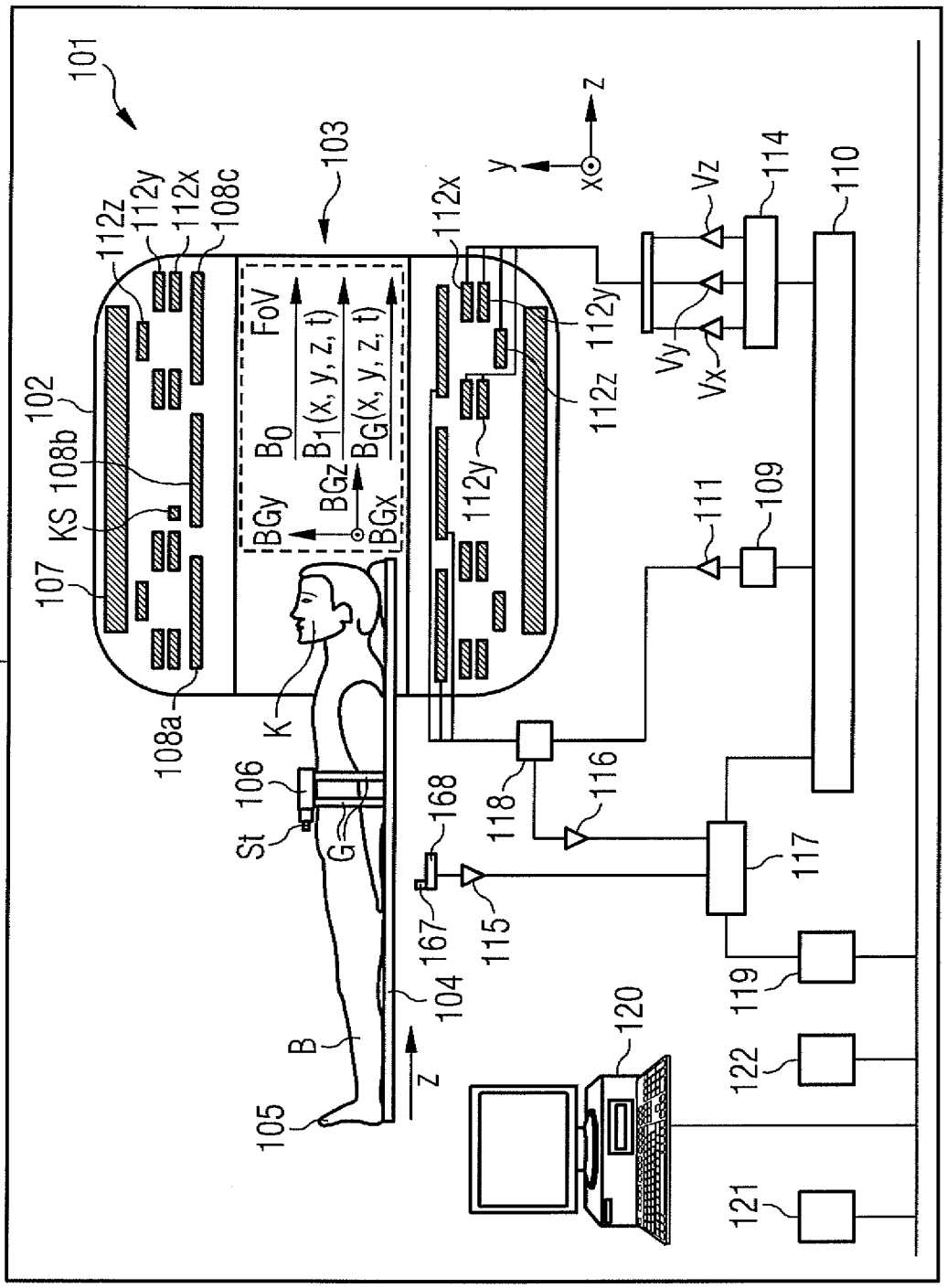

LOCAL COIL

This application claims the benefit of DE 10 2011 086 285.4, filed on Nov. 14, 2011, which is hereby incorporated by reference.

BACKGROUND

The present embodiments relate to a local coil for a magnetic resonance tomography (MRT) system.

Magnetic resonance tomography devices for examination of objects or patients by magnetic resonance tomography (MRT, MRI) are described, for example, in DE10314215B4.

In magnetic resonance tomography, RF coils (e.g., local coils) are used for receiving magnetic alternating fields. In order to obtain a good signal-to-noise ratio (SNR), the geometry and receive profile of the RF coils are adapted for the different areas of the body, and the coils are positioned as close as possible to the body of the patient. For fast, parallel imaging (SENSE, GRAPPA), high-channel array coils including a number of individual coils (e.g., antennas) are used. With the increase in the number of individual coils, the size of the individual coils becomes ever smaller for a pre-specified geometry. With a reduction in the size of the coils, the connection to the patient becomes less, so that the unloaded values of the coils become more important. The connection is defined via the ratio of the unloaded values to the load values. The higher the ratio is, the higher is the SNR of the coil. To improve the SNR, the unloaded value of the coil may have a value that is as high as possible, and/or the mutual influencing of the coils may be minimized. An increase in the height (h) of the copper layer of a coil does not guarantee any further improvement as from a height of approximately five times the thickness of the skin. Likewise, widening the copper layer from a width of w=pi*D does not guarantee any further appreciable value of the unloaded values. Electrical losses, which depend on the distances of the coils from one another, arise at the crossing points of adjacent coils.

Coils with very high quality are constructed from silvered, round copper wires with a diameter of approximately 1 mm. The coils have been inductively decoupled by geometrical overlapping. At the crossing points of the individual coils, the distance has been increased with a wire bridge. For coils with a normal requirement with respect to electrical quality, the antenna elements have been implemented for circuit boards (e.g., plastic carriers) copper-clad on one side. The crossing points may thus be embodied by changing the board sides. The distance may be increased by interspersion of plastic parts.

SUMMARY

The present embodiments may obviate one or more of the drawbacks or limitations in the related art. For example, a local coil for a magnetic resonance device may be further optimized.

BRIEF DESCRIPTION OF THE DRAWINGS

FIG. 5 shows a simplified schematic of one embodiment of a magnetic resonance tomography (MRT) system.

DETAILED DESCRIPTION OF THE DRAWINGS

Figure 1:
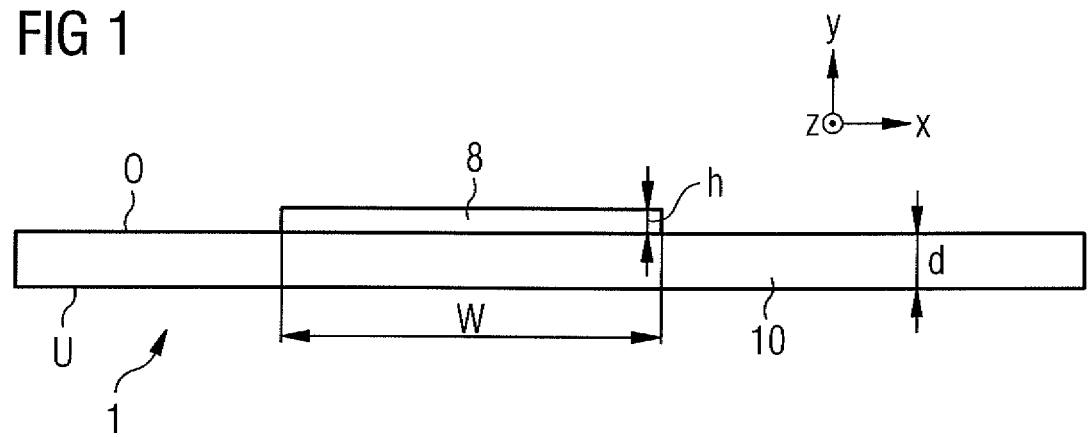
FIG. 1 shows a cross section of one embodiment of a printed circuit board of an antenna element of a local coil with a copper-laminated plastic carrier.

FIG. 5 shows an imaging magnetic resonance device MRT 101 located in a shielded room or Faraday cage F with a whole-body coil 102 (e.g., with a tubular space 103), in which a patient couch 104 with a body 105 (e.g., of an object to be examined such as a patient; with or without a local coil arrangement 106) may be moved in the direction of the arrow z in order to generate images of the patient 105 by an imaging method. Disposed on the patient (e.g., attached with a strap), for example, is a local coil arrangement 106 (e.g., with the same or a further strap), with which in a local area of the MRT 101 (e.g., a field of view (FOV)), images of a part area of the body 105 may be generated in the FOV. Signals of the local coil arrangement 106 may be evaluated by an evaluation device (e.g., including elements 168, 115, 117, 119, 120, 121) of the MRT 101 able to be connected, for example, via coaxial cable or wirelessly (e.g., element 167) to the local coil arrangement 106 (e.g., converted into images, stored or displayed).

In order to examine a body 105 (e.g., an object to be examined or a patient) with a magnetic resonance device MRT 101 using magnetic resonance imaging, different magnetic fields matched as exactly as possible to each other in temporal and spatial characteristic are irradiated onto the body 105. A strong magnet (e.g., a cryomagnet 107) in a measuring compartment (e.g., with a tunnel-shaped opening 103) creates a static strong main magnetic field $B_0$ that amounts to between 0.2 Tesla and 3 Tesla or more, for example. A body 105 to be examined supported on a patient couch 104 is moved into an approximately homogeneous area of the main magnetic field $B_0$ in the FoV. The magnetic resonance of atomic nuclei of the body 105 is excited via magnetic high-frequency excitation pulses $B1(x, y, z, t)$ that are radiated in via a high-frequency antenna (and/or a local coil arrangement) shown in FIG. 6 as a body coil 108 (e.g., a multi-part body coil 108a, 108b, 108c). High-frequency excitation pulses are generated, for example, by a pulse generation unit 109 that is controlled by a pulse sequence control unit 110. After amplification by a high-frequency amplifier 111, the high-frequency excitation pulses are conveyed to the high-frequency antenna 108. The high-frequency system shown in FIG. 6 is merely indicated schematically. In other embodiments, more than one pulse generation unit 109, more than one high-frequency amplifier 111, and a number of high-frequency antennas 108 a, b, c are used in one magnetic resonance device 101.

The magnetic resonance device 101 has gradient coils 112x, 112 y, 112 z available. Magnetic gradient fields for selective slice excitation and for local encoding of the measurement signal are radiated with the gradient coils 112x, 112 y, 112 z during a measurement. The gradient coils 112x, 112y, 112z are controlled by a gradient coil control unit 114 that, like the pulse generation unit 109, is connected to the pulse sequence control unit 110.

Signals transmitted from the excited nuclear resonance (e.g., of the atomic nuclei in the object to be examined) are received by the body coil 108 and/or at least one local coil arrangement 106, amplified by assigned high-frequency preamplifiers 116 and further processed and digitized by a receive unit 117. The recorded measurement data is digitized and stored as complex numerical values in a k-space matrix. An associated MR image may be reconstructed from the k-space matrix occupied by the values using the multidimensional Fourier transformation.

For a coil that may be operated both in transmit mode and also in receive mode (e.g., the body coil 108 or a local coil 106), the correct signal forwarding is regulated by an upstream transceiver switch 118.

From the measurement data, an image processing unit 119 generates an image that is displayed via an operating console 120 to a user and/or stored in a memory unit 121. A central processing unit 122 controls the individual system components.

In MR tomography, images with high signal-to-noise ratio (SNR) are currently recorded with local coil arrangements. The local coil arrangements are antenna systems that are attached in the immediate vicinity at (anterior), below (posterior), on or in the body 105. During an MR measurement, the excited nuclei induce a voltage in the individual antennas. The induced voltage is amplified by a low-noise preamplifier (e.g., LNA, preamp) and is forwarded to the receive electronics. To improve the signal-to-noise ratio even in high-resolution images, high-field systems are used (e.g., 1.5 T and more). If more individual antennas may be connected to an MR receive system than there are receivers available, a switching matrix (e.g., an RCCS) is inserted between receive antennas and receivers. This matrix routes the currently active receive channels (e.g., the receive channels that currently lie in the field of view of the magnet) to the available receivers. This makes it possible to connect more coil elements than there are receivers available, since for whole body coverage, only the coils that are located in the FoV or in the homogeneity volume of the magnet may be read out.

In one embodiment, a local coil arrangement 106 is an antenna system that may include one or, as an array coil, a number of antenna elements (e.g., coil elements), for example. The individual antenna elements are, for example, configured as loop antennas (e.g., loops), butterfly coils, flex coils or saddle coils. A local coil arrangement may include coil elements, a preamplifier, further electronics (e.g., sheath current filters), a housing, supports and a cable with plug, through which the local coil arrangement is connected to the MRT system. A receiver 168 attached to the system side filters and digitizes a signal received from a local coil 106 (e.g., wirelessly) and transfers the data to a digital signal processing device that may derive an image or a spectrum from the data obtained by a measurement and makes the image or the spectrum available to the user (e.g., for subsequent diagnosis by the user and/or for storage).

A few exemplary embodiments of one embodiment of an MRT local coil 106, local coil antenna elements 1-5 (e.g., coils or antenna elements) of the local coil 106 and printed circuit boards with conductor tracks (of the local coil antenna elements 1-5 of the local coil 106) are described below in greater detail with reference to FIG. 1-4:

FIG. 1 shows a cross section of a printed circuit board 10 embodied as an insulator (e.g., an electrically non-conducting insulator) of an antenna element 1.) The local coil 106 includes a plastic carrier 10 (e.g., a printed circuit board 10) of thickness d having, on one side, a conductor track 8 of height h consisting of copper (e.g., copper-clad), for example, on an upper side O. The printed circuit board 10 also includes connections and other components.

Figure 2:
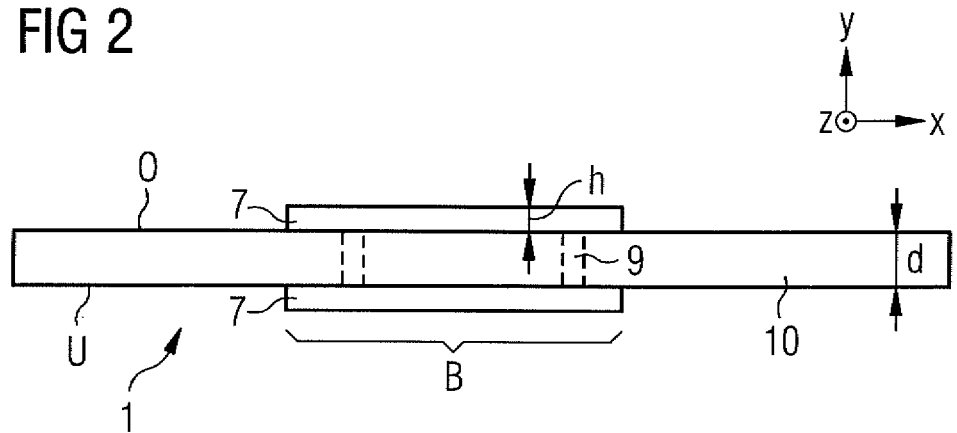
FIG. 2 shows a cross section of one embodiment of a printed circuit board of an antenna element of a local coil with a plastic carrier having copper conductor tracks on both sides and being an insulator between the conductor tracks.

FIG. 2 shows a cross section of the printed circuit board 10 of an antenna element 1 of a local coil 106 with conductor tracks 7 (e.g., copper conductor tracks 7) arranged on both sides (e.g., on the upper side O and the lower side U) of the printed circuit board 10. The circuit board 10 includes an insulator such as plastic, for example. The conductor tracks are connected electrically-conductively to each other by plated through-holes 9 through the electrically-insulating printed circuit board 10.

In FIG. 2, the two copper conductor tracks 7 run (e.g., in an area B, in which the conductor tracks, seen from above, do not partly overlap or cross (c) other conductor tracks of further antenna elements 2, 3, 4, 5) parallel to one another and are separated from one another by an insulator in the form of the printed circuit board 1 made of plastic.

The insulator 10 in the form of the plastic printed circuit board 1 may simultaneously serve as a carrier material (FIG. 2).

The thickness (d) of the carrier material and the height (h) of the conductor track may, for example, each be at least double the skin depth of the conductor material (e.g., of the conductor tracks 7; for conductor tracks 7 made of copper for an MRT excitation frequency of 120 MHz, at least 2×7 micrometers ($\mu m$)).

For example, at least at locations at which capacitors for achieving the resonant frequency in the printed circuit board 10 are inserted, the at least two parallel copper tracks 7 (e.g., upper (O) and lower (U) on the printed circuit board 10 of the antenna 1) are connected to each other with the aid of plated through-holes 9 through the printed circuit board 10.

Figure 3:
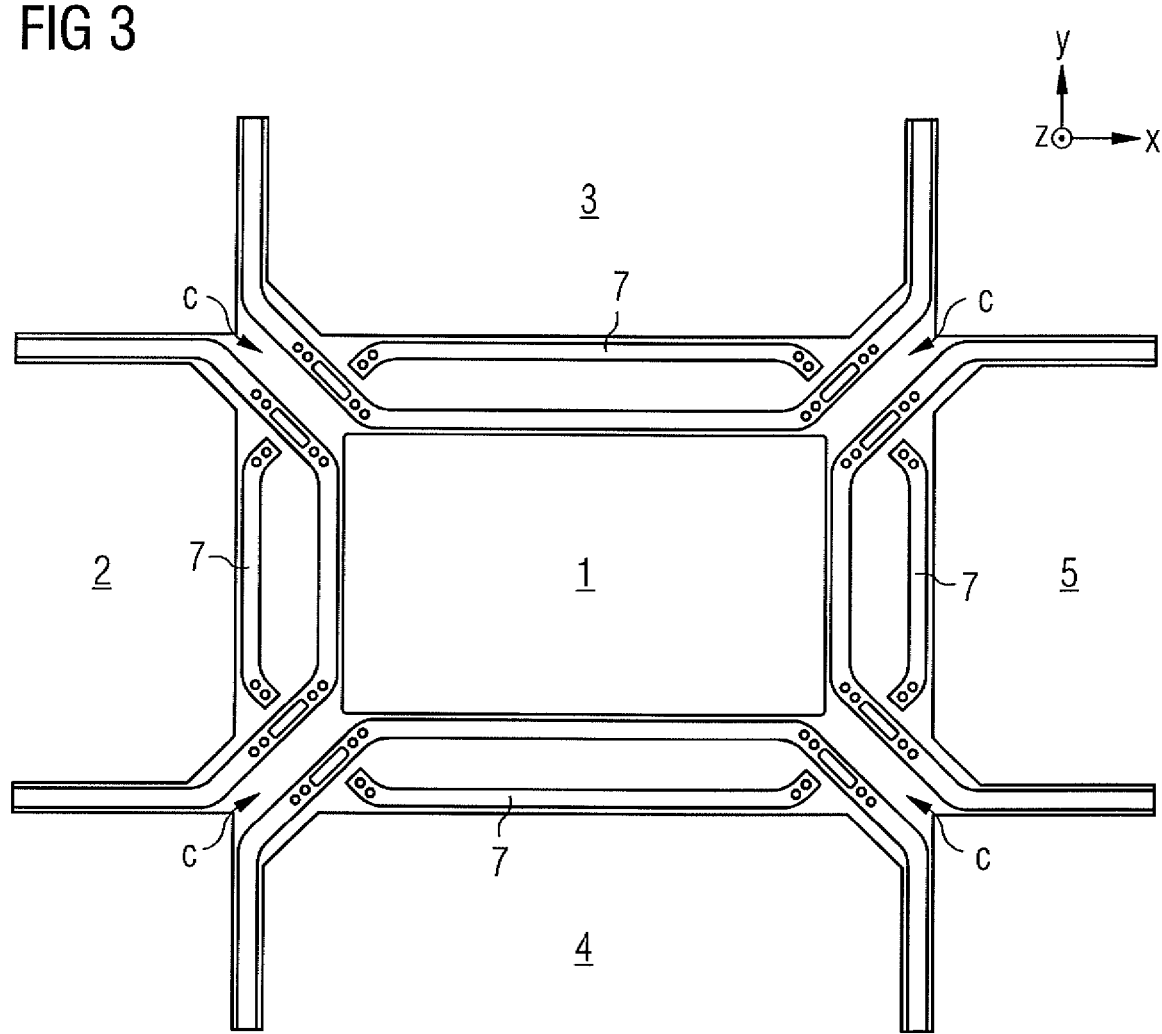
FIG. 3 shows an overhead view of one embodiment with five antenna elements with conductor tracks of the antenna elements running in crossing areas.
Figure 4:
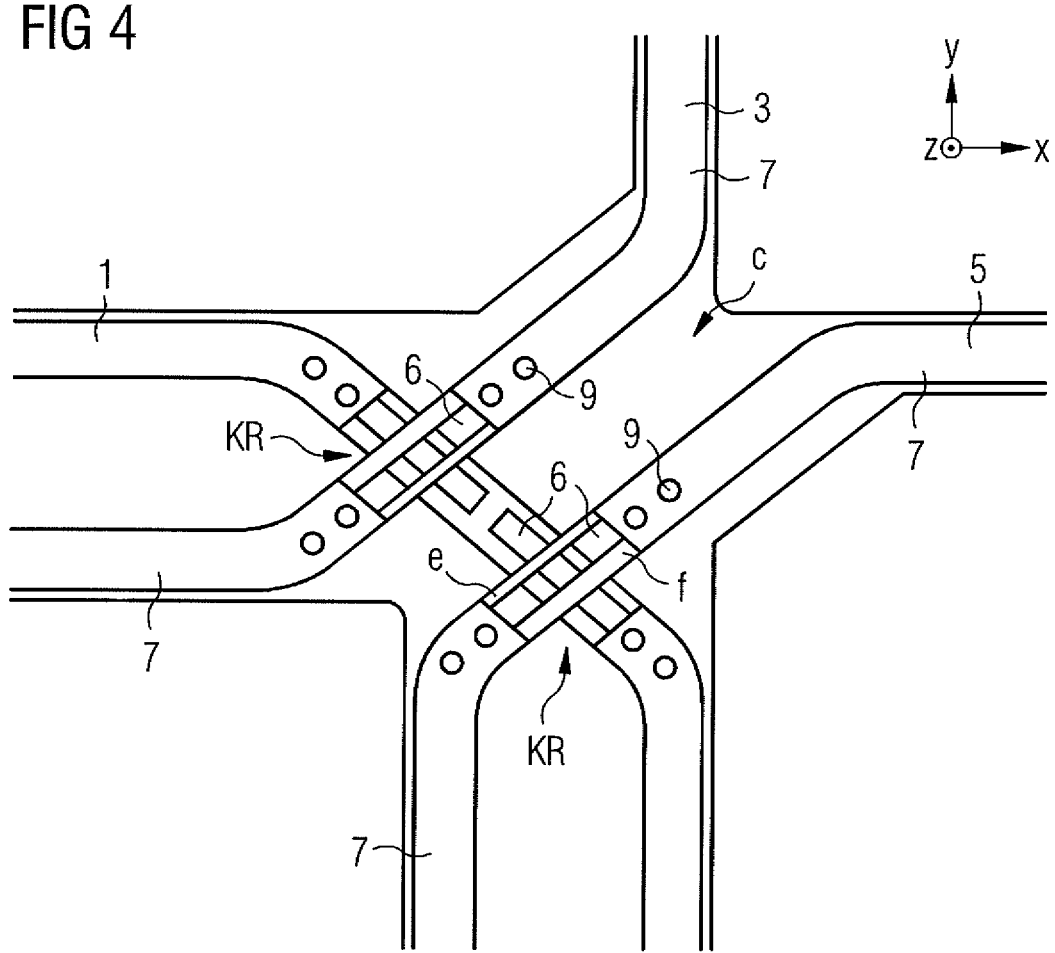
FIG. 4 shows an overhead view of a section of an exemplary crossing area with three conductor tracks running in a cross area of three antenna elements.

FIG. 3 shows the antenna element 1 with four antenna elements 2-5 adjacent to the antenna element 1. In crossing areas c of antenna elements, conductor tracks 7 (e.g., of different antenna elements 1-5) cross each other (e.g., not touching each other in layers above one another). In FIG. 4, for example, conductor tracks 7 of the antenna elements 3, 5 are shown crossing above (e.g., z, on the upper side O) conductor tracks 7 (e.g., on the lower side U) of the antenna element 1, while in FIG. 3, conductor tracks 7 of the antenna elements 2, 3, 4, 5 are shown crossing (O) above (z) conductor tracks 7 (e.g., on the lower side U) of the antenna elements 1.

Crossing of antenna elements or of crossing of the conductor tracks in relation to one another provides, for example, that with a theoretical view through the printed circuit boards, at least one conductor track 7 of the one antenna element 1 runs above or below a conductor track 7 of the further antenna element 3 (e.g., without electrical contact with this element) crossing at right angles or obliquely in relation to the latter conductor track 7. In other words, at least one conductor track 7 of the one antenna element 1 runs below (U) a printed circuit board 10 and at least one conductor track 7 of the further antenna elements 3 and/or 5 (e.g., without electrical contact with 1) runs crossing at right angles or obliquely (e.g., in relation to the antenna element 1) above (O) the printed circuit board 10 or a further printed circuit board.

At the crossing points c (e.g., only there), the copper tracks 7 are, for example, all uninterrupted or at least two copper tracks 7 only run on one side of the printed circuit board (e.g., only run above (O) or only below (=U) on the printed circuit board of the antenna 1), so that in areas c, in which the conductor tracks 7 of at least two antenna elements (e.g., the two conductor tracks 3, 5 crossing over the conductor track 1 in FIG. 4) cross, the latter antenna elements (e.g., antenna elements 3, 5 and 1 in FIG. 4) only have a continuous conductor track 7 on one side (O; U) of the insulator 10. In FIG. 3, the conductor track 7 of the antenna element 1 is interrupted in the view shown of the upper side O of the printed circuit board 10 (e.g., with a gap), and the conductor tracks 7 of the antenna elements 2, 3, 4, 5 are continuous. On the lower side U of the printed circuit board (not shown in FIG. 3), the conductor track 7 of the antenna element 1 may be uninterrupted, and the conductor tracks 7 of the antenna elements 2, 3, 4, 5 may be interrupted.

Also depicted in FIGS. 3 and 4 are areas c of antenna elements 1-5, in which antenna elements 1-5 and/or conductor tracks 7 of the antenna elements 1-5 are adjacent to one another (e.g., closest to one another). In FIG. 3, for example, the conductor tracks 7 of the antenna elements 3, 5 in area c (e.g., neighboring area) are closest (e.g., spaced apart without being in contact with one another), and the conductor tracks 7 of the antenna elements 3, 5 run in area c (e.g., approximately where the conductor tracks 7 are slotted 6) in parallel, and do so in the same plane (e.g., above (O) or below (U) on their printed circuit board 10).

In the areas c, the conductor tracks 7 are slotted, for example, by slots 6, where an outer conductor track width of the slotted conductor track remains constant in the slots (e.g., in accordance with FIG. 4).

As FIG. 4 shows by way of example, a respective slot 6 in a conductor track 7 of an antenna 3 may lie axis symmetrically to a slot 6 in a conductor track 7 of the neighboring antenna 5 to the antenna 3. Induced eddy currents in the conductor track 7 of a further antenna 5 lying opposite a conductor track 7 of an antenna 3 are minimized by this. Thus, inductively coupled-in losses are reduced. By a slot 6, a space between coils or antennas 3, 5 adjacent to one another that would otherwise be necessary in a neighboring area c of the antennas 3, 5 may be reduced.

In a further embodiment, a bar f of a slot 6 that runs on the inner side of the antenna element 1 may be wider than a bar c lying opposite the bar f (e.g., on the slot 6). Because of the proximity effect, the current density on the inner side of the coil conductors or conductor tracks is higher than on the outer side.

In one embodiment, the coil conductors 7 may be embodied in more than two layers. Thus, for example, in a three-layer board, the conductor track may also be present on both sides at the crossing points.

The unloaded quality of one embodiment may correspond to that of a coil constructive with copper wire and may do so with a low-cost and well-reproducible antenna structure.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for a magnetic resonance tomography device, the local coil comprising:
   a plurality of antenna elements,
   wherein an antenna element of the plurality of antenna elements has two conductor tracks that are disposed on opposite sides of an insulator and are connected electrically-conductively to one another by plated through-holes through the insulator,
   wherein in at least one area, in which conductor tracks of at least two antenna elements of the plurality of antenna elements cross, at least one antenna element of the two antenna elements only has a conductor track on one side of the insulator, and
   wherein at least in areas, at which capacitors are inserted into the local coil, at which conductor tracks cross, or at which capacitors are inserted into the local coil and at which conductor tracks cross, conductor tracks of a respective antenna element of the plurality of antenna elements are connected to one another by plated through-holes.

2. The local coil as claimed in claim 1, wherein only in the at least one crossing area of the at least two antenna elements, in which the conductor tracks of the at least two antenna elements cross one another, at least one antenna element of the at least two antenna elements only has a continuous conductor track on a lower side of the insulator, and at least one further antenna element of the at least two antenna elements only has a continuous conductor track on an upper side of the insulator.

3. The local coil as claimed in claim 1, wherein conductor tracks of more than two antennas of the plurality of antennas cross in crossing areas.

4. The local coil as claimed in claim 3, wherein crossing conductor tracks of a subset of antenna elements of the plurality of antenna elements are spaced apart from one another without electrical contact.

5. The local coil as claimed in claim 1, wherein the crossing conductor tracks of a subset of antenna elements of the plurality of antenna elements are spaced apart from one another without electrical contact.

6. The local coil as claimed in claim 1, wherein each antenna element of the plurality of antenna elements has at least two conductor tracks running in parallel to one another in an area.

7. The local coil as claimed in claim 1, wherein the thickness of the insulator of the antenna element, the height of the conductor tracks of the antenna element, or the thickness of the insulator of the antenna element and the height of the conductor tracks of the antenna element are at least double a skin depth of a material, of which the conductor tracks are made.

8. The local coil as claimed in claim 1, wherein the conductor tracks are made of copper.

9. The local coil as claimed in claim 1, wherein in areas, in which two antenna elements of the plurality of antenna elements are closest to one another without crossing one another, conductor tracks of the two antenna elements run in parallel to one another on a same side of the insulator.

10. The local coil as claimed in claim 1, wherein the crossing of conductor tracks of the at least two antenna elements includes that at least one conductor track of a first antenna element of the at least two antenna elements runs at right angles or obliquely across at least one conductor track of a second antenna element of the at least two antenna elements.

11. The local coil as claimed in claim 10, wherein the crossing of the conductor tracks of the at least two antenna elements includes that the at least one conductor track of the first antenna element of the at least two antenna elements runs at right angles or obliquely across the at least one conductor track of the second antenna element of the at least two antenna elements without electrical contact.

12. The local coil as claimed in claim 1, wherein in areas, in which the conductor tracks of the at least two antenna elements cross, at least one antenna element of the at least two antenna elements only has a conductor track on one side of the insulator to the extent that the conductor track of the at least one antenna element is interrupted on the other side of the insulator in the area.

13. The local coil as claimed in claim 1, wherein the insulator comprises a carrier material, a printed circuit board, or the carrier material and the printed circuit board.

14. A local coil for a magnetic resonance tomography device, the local coil comprising:
   a plurality of antenna elements,
   wherein an antenna element of the plurality of antenna elements has two conductor tracks that are disposed on opposite sides of an insulator and are connected electrically-conductively to one another by plated through-holes through the insulator,
   wherein in at least one area, in which conductor tracks of at least two antenna elements of the plurality of antenna elements cross, at least one antenna element of the two antenna elements only has a conductor track on one side of the insulator, and
   wherein in one or more areas, in which conductor tracks of at least two antenna elements of the plurality of antenna elements run in parallel to one another on a same side of the insulator, the conductor tracks of the at least two antenna elements are slotted by slots.

15. The local coil as claimed in claim 14, wherein the conductor tracks of the at least two antenna elements are slotted by the slots with an unchanged outer conductor track width compared to a non-slotted area.

16. A local coil for a magnetic resonance tomography device, the local coil comprising:
   a plurality of antenna elements,
   wherein an antenna element of the plurality of antenna elements has two conductor tracks that are disposed on opposite sides of an insulator and are connected electrically-conductively to one another by plated through-holes through the insulator,
   wherein in at least one area, in which conductor tracks of at least two antenna elements of the plurality of antenna elements cross, at least one antenna element of the two antenna elements only has a conductor track on one side of the insulator, and
   wherein the two conductor tracks have a slot that lies symmetrically to a slot of a conductor track of a further antenna element of the plurality of antenna elements.

17. A local coil for a magnetic resonance tomography device, the local coil comprising:
   a plurality of antenna elements,
   wherein an antenna element of the plurality of antenna elements has two conductor tracks that are disposed on opposite sides of an insulator and are connected electrically-conductively to one another by plated through-holes through the insulator,
   wherein in at least one area, in which conductor tracks of at least two antenna elements of the plurality of antenna elements cross, at least one antenna element of the two antenna elements only has a conductor track on one side of the insulator, and
   wherein on one or more slots of one or more conductor tracks of the plurality of antenna elements, a first bar that runs on an inner side of the conductor track is wider than a second bar opposite the first bar, the second bar running on an outer side of the conductor track.

18. The local coil as claimed in claim 17, wherein the inner side of the conductor track of the antenna element is a side pointing towards a central point, and the outer side of the conductor track of the antenna element is a side pointing away from the central point.

19. A local coil for a magnetic resonance tomography device, the local coil comprising:
   a plurality of antenna elements,
   wherein an antenna element of the plurality of antenna elements has two conductor tracks that are disposed on opposite sides of an insulator and are connected electrically-conductively to one another by plated through-holes through the insulator,
   wherein in at least one area, in which conductor tracks of at least two antenna elements of the plurality of antenna elements cross, at least one antenna element of the two antenna elements only has a conductor track on one side of the insulator, and
   wherein the antenna element or another antenna element of the plurality of antenna elements has at least three layers of conductor tracks above one another.

* * * * *